United States Patent [19]

Rice

[11] Patent Number: 5,056,461
[45] Date of Patent: Oct. 15, 1991

[54] CIRCUIT BOARD DIPPING FIXTURE

[75] Inventor: René R. Rice, Wind Lake, Wis.

[73] Assignee: The Paint Line Supply Co., Inc., Burlington, Wis.

[21] Appl. No.: 535,433

[22] Filed: Jun. 8, 1990

[51] Int. Cl.$^5$ .......................... B05C 3/02; B05C 3/10
[52] U.S. Cl. .................................. 118/663; 118/686; 118/400; 118/429; 118/500; 198/475.1
[58] Field of Search ............... 118/400, 429, 500, 423, 118/428, 663, 686, 693, 694; 198/678, 681, 475.1, 797, 799

[56] References Cited

U.S. PATENT DOCUMENTS

| | | | |
|---|---|---|---|
| 1,550,248 | 8/1925 | Gehnrich | 198/797 |
| 1,963,314 | 6/1934 | Savell et al. | 198/797 |
| 2,964,007 | 12/1960 | Buffington | 228/12 |
| 3,566,891 | 3/1971 | Koch | 134/61 |
| 3,956,540 | 5/1976 | Laliberte et al. | 427/443.2 |
| 4,597,931 | 7/1986 | Watanabe et al. | 264/129 |
| 4,794,018 | 12/1988 | Scheetz | 363/16 |
| 4,840,821 | 6/1989 | Miyaki et al. | 427/430.1 |

FOREIGN PATENT DOCUMENTS 0007494 1/1990 Japan .................................. 118/400

Primary Examiner—Willard E. Hoag
Attorney, Agent, or Firm—Wheeler Law Firm

[57] ABSTRACT

A fixture for supporting a circuit board in a position generally horizontal to the surface of the protective material in the tank as it is dipped into a tank and coated with protective material. This allows a precisely predetermined area of the circuit board to be dipped into the protective coating material. The fixture has pivots above its center of gravity allowing the fixture to pivot will respect to a conveyor system so the position of the circuit board is maintained as generally horizontal to the surface of the protective material in the tank.

A weir is used to control the level of the surface of the protective material in the tank. Sonar is used for sensing the distance between the surface of the protective material and a fixed point. Jacks are used to adjust the level of the tank and thus control the depth to which said circuit board is dipped into said protective material so that the depth of each dip is controlled to a minimum of 0.38 mm. The invention allows only a predetermined portion of the circuit board to be coated with the protective material. Accordingly, there is no need for masking other portions of said circuit board with masking material and time is saved in producing the coated circuit boards.

8 Claims, 1 Drawing Sheet

CIRCUIT BOARD DIPPING FIXTURE

BACKGROUND OF THE INVENTION

The device of the instant invention relates to fixtures for dipping electronic circuit boards into a tank of a clear liquid protective coating to waterproof the circuit board. Specifically, it is desirable not to coat certain parts of or on a circuit board; for example, edge pins that are designed to allow the board to be plugged into another component.

In the past circuit boards have been dipped in this coating while oriented so that they are hanging down vertically from the workpiece holder bars normally used. This requires parts of the circuit board that are not to be dipped to be covered with a masking substance. The masking substance prevents the coating material into which the circuit boards are dipped from adhering to such things as electrical connections at the edges of circuit boards, pins for plugs, and the like. This is a very time consuming step, and the masking must be removed after the dipping and the curing of the coating are achieved. By means of a unique and simple design my invention eliminates the need for masking and demasking steps, yet allows very precise control over the boundary between dipped and undipped parts. The circuit board is designed to optimize dipping with the device of this invention.

Nowhere does the prior art reveal the unique and simple design of my invention for avoiding the necessity of masking a circuit board. U.S. Pat. No. 4,794,018 (Scheetz) shows an apparatus and method to avoid coating undesired areas on a P.C. Board. However, the structure of the apparatus and the method are completely different from my apparatus and method. Scheetz does disclose the use of a drain edge which functions like a weir but does not reveal anything else that is even similar to the structure of my invention. U.S. Pat. No. 2,964,007 (Buffington) discloses a "Dip Soldering Machine" for soldering circuit boards. Buffington merely shows that the level of solder in the tank is controlled by a float switch incapable of the close control required here. The function and structure of this machine are completely different from that of my invention. My invention relates to the use of protective coating materials and not solder. Buffington is designed to solder components to a printed circuit and requires the use of a stainless steel template 82 to achieve soldering in the proper manner. U.S. Pat. No. 3,566,891 (Koch) shows a conveyor system with an adjustable pool. Koch is designed for and teaches "a tank arrangement particularly adapted for processing small parts characterized by the indexing of several tanks into processing positions through simultaneous vertical movement". (Abstract of Koch patent.) Koch does not show the structure or the advantage of my invention. U.S. Pat. No. 3,956,540 (Laliberte et al) shows a structure in which the level of material within the tank is controlled by means of electric eye beams. (Col. 5, lines 66+.) This structure functions by raising and lowering the dip tank containing the coating solution. The purpose of Laliberte is to cover an object with a coating of a predetermined thickness. The idea is to coat an entire workpiece, like an optical lens, with the desired type of coating. Col. 1, lines 64–67. Nowhere does Laliberte teach or even suggest the desirability of the structure or function of my invention for coating only a desired part of a circuit board. U.S. Pat. No. 4,597,931 (Watanabe et al) discloses a method for manufacturing a windshield having a coating of varying thickness. Essentially, a base windshield is suspended over a dipping tank 23 containing a silicone coating solution 24. The tank 23 is raised and lowered in a manner designed to vary the thickness of the coating on the base windshield. The coating does not terminate at a precise edge. This structure neither teaches nor reveals my invention. Finally, U.S. Pat. No. 4,840,821 (Miyazaki et al) merely discloses an apparatus and method for forming an LB film on a substrate in which the film is deposited by raising and lowering the surface of the liquid on which a group of molecules is spread relative to the substrate. This does not teach my invention. The main difference between my invention and the prior art is that the circuit boards are mounted on the fixture in a position such that the plane of the circuit board is horizontal or substantially horizontal. With the other elements for precise control of the level of the liquid coating, this achieves a precision of location of the coating edge that allows parts to be located on the high edge of the circuit board, or projecting upwardly, where coating will not occur.

It is the objective of my invention to eliminate the need for using a masking substance when dipping a circuit board.

It is a further objective of my invention to be able to control the depth to which the circuit board is dipped to about 0.015 inches or approximately 0.38 millimeters (mm).

It is a further objective of my invention to dip circuit boards in a generally horizontal rather than vertical orientation.

It is a further objective of my invention to allow for a quick change of tooling thus improving the speed and efficiency of the manufacturing process.

SUMMARY OF THE INVENTION

My invention is for use in a machine for coating an electronic circuit board with a protective material by dipping the circuit board into the protective material which is held in a dip tank. A conveyor system is used to move the circuit board through the machine.

The device of my invention is an improved fixture and leveling device for dipping circuit boards into coating mixtures. By tilting the board slightly with respect to the horizontal direction (horizontal being defined by the surface of the protective coating material in the dip tank into which the board is dipped) the pins at the edge of the board or other desired structure can be kept above the surface of the protective material while the board is dipped. It is relatively easy to design a board so that the pins can be handled in this way if it is known that the board will be dipped while it is a few degrees from the horizontal. No equipment to do that has been used in this industry so far as is known. Because the desired structure is never dipped, it need not be masked; accordingly, it need not be unmasked after it is dipped. This eliminates time consuming steps; steps that can possibly damage a circuit board.

A necessary condition of this means of avoiding masking certain parts of the board is that the depth to which the board is dipped be controlled to about 0.015 inches or 0.38 mm. In the old system of dipping it was not necessary to know with any great precision how deep the board would be dipped because the parts that were not to be coated were masked. The depth was controlled but not with any great precision. The depth of the dip tank is difficult to control with precision because the protective material into which the circuit boards are dipped is viscous and must also be circulated constantly in order to keep it from setting prematurely. The combination of constant circulation and fairly high viscosity made control of the depth of the dip tank somewhat uncertain in the prior art process.

In order to obtain fine control of the depth, the tank containing the protective coating material is provided with a weir or dam over which the liquid flows to a re-circulation pump. In addition a sonar beam or its equivalent is aimed at the surface of the protective material to obtain a precise distance from the surface of the material to a fixed predetermined point; e.g., the housing of the machine or the source of the sonar beam itself. The fixture will normally have only one type of circuit board engaged with it. The point of engagement on the fixture is a detachable dummy plug. Accordingly, an operator can very readily and accurately position the circuit board because the dummy plugs on the workpiece support bar align the board very accurately making subsequent adjustment unnecessary.

The dipping fixture is comprised essentially of at least two pivot blocks, at least one work piece holding bar and at least one dummy plug for holding at least one circuit board in place. The pivot blocks are located at each end of the holding bar and are fixedly mounted to the holding bar. Each block has a pivot support at each end and is arranged so that the center of gravity of the fixture is below the pivot point. The holding bar is thus gravity biased to its lowest position. The pivots are carried on chain conveyors at each end of the dipping fixture so that the holding bar is generally oriented horizontally between and at a right angle to the chain conveyors. The elevation of the chain conveyor is fixed, very accurately, by adjusting the location of the sprockets that drive the chains. Thus the vertical elevation of the circuit board itself is very accurately known as it dips into the tank of coating solution. The vertical elevation of the protective coating material in the tank is also known because a sonar beam measures it. As noted previously, the weir keeps the level of the protective coating material in the tank constant. The final control is that the tank itself rests on very slow motor driven screw jacks. These jacks are controlled by determining the distance between the surface and a predetermined fixed point, for example the cabinet of the machine containing the dipping tank, and then adjusting the jacks by using the motor driven screws. This may be done by manually closing a circuit to the jacks until the sonar reading is correct, or in the alternative a control circuit actuated by the sonar reading may continuously adjust the jacks to maintain the precise desired level. Alternatively, instead of using several screw jacks a single scissor jack may be used. The movement of the scissor jack could be controlled by a single screw.

The proper dip level is established by running a test dip of the board and then examining that test piece. If the level of the dip tank needs to be adjusted the level can be accurately adjusted using the sonar measurement. The level of protective material in the tank remains constant because of the weir and the recirculation pumping system. Once the proper level is set the production pieces may be quickly and easily dipped into the protective material. Once set the level of the conveyor remains fixed throughout the production run. If discrepancies develop during the production run the level of the dip tank may be adjusted automatically or manually during the production run.

Accordingly, my invention is in a machine for coating an electronic circuit board with a protective material by dipping said circuit board into the protective material, having a tank for holding the protective material and a conveyor system for moving the circuit board through the machine, and consists essentially of a fixture for supporting the circuit board as it passes through the machine and is coated with the protective material; the fixture supporting said circuit board in a generally horizontal position to the surface of the protective material in said tank so that a predetermined area of the circuit board is dipped into the protective material; the fixture having pivot means for pivoting located generally above the center of gravity of said fixture; the pivot means engageable with the conveyor system so that the fixture may pivot with respect to the orientation of the conveyor system and the circuit board is maintained in the generally horizontal position to the surface of the protective material; level control means for controlling the level of the surface of said protective material in said tank. My invention may be further refined by adding sensor means, for sensing the distance between the surface of the protective material and a predetermined point and depth control means, for controlling the depth to which the circuit board is dipped into the protective material so that the depth of the dip is controlled to a minimum of 0.38 mm, whereby a predetermined portion of the circuit board is coated with the protective material without the need for masking other portions of the circuit board with masking material.

These and other benefits of the present invention will be apparent to one skilled in the art from the following description.

DETAILED DESCRIPTION

Figure 2:
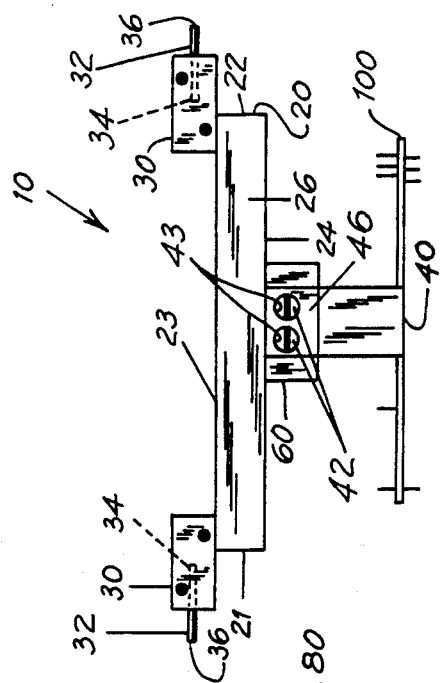
FIG. 2 is a perspective view of the invention.
Figure 3:
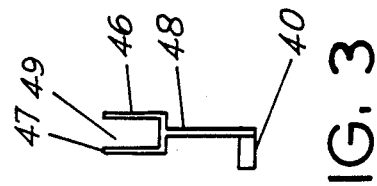
FIG. 3 is a perspective view of the dummy plug.
Figure 1:
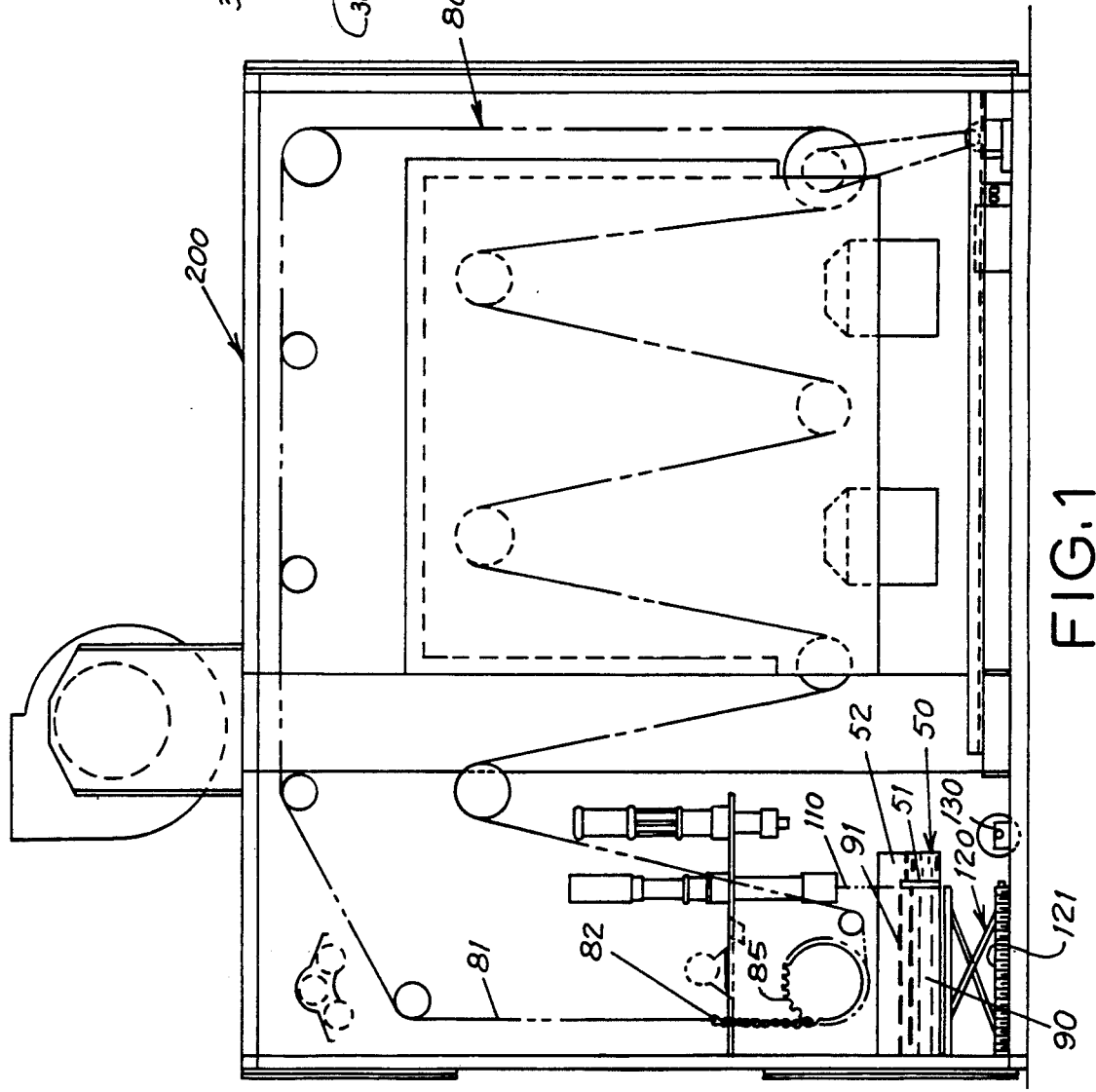
FIG. 1 is a side plan view of the machine containing the invention.

Although the disclosure hereof is detailed and exact to enable those skilled in the art to practice the invention, the physical embodiments herein disclosed merely exemplify the invention which may be embodied in other specific structure.

The device of the instant invention is a dipping fixture 10 comprising workpiece holding bar 20, two pivot blocks 30, two pivot rods 32, and a dummy plug 40 for mounting the circuit board 100 to the dipping fixture 10. The invention is generally for use in a machine 200 for coating an electronic circuit board 100 with a protective material 90 by dipping the circuit board 100 into the protective material 90 which is held in a dip tank 50. A conveyor system 80 is used to move the circuit board 100 through the machine 200.

The workpiece holding bar 20 has two ends 21 and 22, a top surface 23, a bottom surface 24, and two side surfaces 25 and 26. The pivot blocks 30 are fixedly mounted to the top surface 23 at each end 21 and 22 of the workpiece holding bar 20. Each pivot block 30 has a receptacle 34 for holding the pivot rods 32.

The workpiece holding bar 20 also has an integral, generally rectangular, branch 60. The branch 60 extends from the bottom surface 24 of the workpiece holding bar 20. Clamped to the branch 60 is the dummy plug 40. The dummy plug 40 is clamped onto the branch 60 by means of set screws 42. The plug 40 has a mounting end 48 to which branch 60 of the circuit board 100 may be attached. End 48 is forked into two branches 46 and 47. The two branches 46 and 47 have a gap or opening 49 between them. Branch 46 has two openings 43. Set screws 42 extend through the openings 43. Branch 60 of the workpiece holding bar 20 fits into the opening 49. By tightening the set screws 42 branch 60 is held in place between branches 46 and 47 of the dummy plug 40. Because the entire dummy plug 40 assembly may be detached from the workpiece holding bar 20 any number of different types of dummy plugs 40, designed for various configurations of circuit boards 100, may be used. The dummy plug 40 fits tightly on a receptacle 101 on the circuit board 100 to precisely position the circuit board 100. The branch 60 and dummy plug 40 may thus be oriented so that only the desired parts are dipped, as long as the plug 40 and the receptacle 101 are fully engaged, a simple step.

The entire dipping fixture 10 is supported between two chains 81 of the conveyor system 80 by the pivots 32. The ends 36 of the pivots 32 are designed to engage the links 82 of the chains 81 so that, as the fixture 10 hangs from the chains 81, the fixture 10 may rotate freely regardless of the orientation of the chains 81. This allows the circuit board 100 to be maintained in a generally horizontal position to the coating material 90 even when the chains 81 are moving perpendicular to the surface 91 of the coating material 90. This is because the center of gravity of the fixture 10 is designed to be located so that when the circuit board 100 is attached to the dummy plug 40, the fixture 10 will hang on the pivot rods 34 from the chains 80, biased by gravity in a manner that keeps the board 100 generally horizontal to the surface 91 of the coating material. The force of gravity will always keep the board 100 in that position so long as the pivot rod ends 36 can freely rotate.

Further, the rate of speed at which the chains 81 are driven by the sprockets 85 is such that there is, generally, no rocking of the fixture 10. The generally horizontal orientation of the board 100 with respect to the surface 91 of the coating material 90 is maintained.

By adjusting the location of sprockets 85 the elevation of the conveyor chains 81 may be very accurately calibrated so that the vertical elevation of the circuit board 100 is known. Additionally, the dipping of the circuit board 100 into the coating material 90 may be controlled to within 0.38 mm by using the combination of a sonar beam 110 and a scissor jack 120. The sonar beam 110 measures the distance between the surface 91 of the protective coating material 90 and a fixed point; e.g. the source point of the sonar beam. Thus the location of the protective coating material 90 in the tank 50 is known with respect to a fixed point. The level of the tank 50 may be adjusted by means of the jack 120. The need to raise or lower the tank 50 is determined by examining a test piece and adjusting the level of the tank 50 accordingly. Because a screw drive 121 is used to control the movement of the jack 120, fine control over the depth to which the board 100 is dipped is possible. When the test piece is dipped to the required level, subsequent pieces will likewise be so dipped. The sonar mechanism may output a correction signal that automatically maintains the liquid level, using the screw drive 121 or the liquid pumps 130 to affect the level as required.

The level of the coating material 90 within the tank 50 is kept constant by the use of a weir 51. The weir 51 allows for constant circulation of the protective coating material 90 through the tank 50. The protective coating material 90 can be pumped from the weir reservoir 52 back into the tank 50. The level of the surface 91 of the protective coating material 90 is always constant within the tank 50 because the protective coating material 90 continually flows over the weir 51 and is recirculated. This continual flow has the added benefit of preventing the premature curing and setting of the protective coating material 90.

The foregoing is considered as illustrative only of the principles of the invention. Furthermore, since numerous modifications and changes will readily occur to those skilled in the art, it is not desired to limit the invention to the exact construction and operation shown and described. While the preferred embodiment has been described, the details may be changed without departing from the invention, which is defined by the claims.

What is claimed is:

1. In a machine for coating an electronic circuit board with a protective material by dipping said circuit board into said protective material, having a tank for holding said protective material and a conveyor system for moving said circuit board though said machine, the improvement comprising:

a fixture for supporting said circuit board from said conveyor system as it passes through said machine and is coated with said protective material;

said fixture supporting said board in a generally horizontal position to the surface of said protective material in said tank so that a predetermined area of said circuit board is dipped into said protective material;

pivot means engageable with said conveyor system such that said fixture may pivot with respect to the orientation of said conveyor system and said circuit board is maintained in said generally horizontal position to said surface of said protective material;

said tank having level control means for controlling the level of said surface of said protective material in said tank to a high accuracy with respect to the horizontal position of said circuit board;

sensor means for sensing the distance between said surface of said protective material and a predetermined point;

dip depth control means responsive to said sensor means, for controlling the depth to which said circuit board is dipped into said protective material so that said depth of said dip is controlled to minimum of 0.38 mm; whereby a predetermined portion of said circuit board is coated with said protective material with out the need for masking other portions of sid circuit board with making material.

2. In a machine for coating an electronic circuit board with a protective material by dipping said circuit board into said protective material, having a tank for holding said protective material and a conveyor system for moving said circuit board through said machine, the improvement comprising:

a fixture for supporting said circuit board as it passes through said machine and is coated with said protective material;

said fixture supporting said circuit board in a generally horizontal position to the surface of said protective material in said tank so that a predetermined area of said circuit board is dipped into said protective material;

said fixture having pivot means for pivoting located generally above the center of gravity of said fixture;

said pivot means being capable of engaging said conveyor system so that said fixture may pivot with respect to the orientation of said conveyor system and said circuit board is maintained in said generally horizontal position to said surface of said protective material;

level control means for controlling the level of said surface of said protective material in said tank;

sensor means for sensing the distance between said surface of said protective material and a predetermined point;

dip depth control means responsive to said sensor means, for controlling the depth to which said circuit board is dipped into said protective material so that said depth of said dip is controlled to a minimum of 0.38 mm;

whereby a predetermined portion of said circuit board is coated with said protective material without the need for masking other portions of said circuit board with masking material.

3. The device of claim 2 in which said pivot means comprises:

at least one pivot block having at least one receptacle containing at least one pivot rod.

4. The device of claim 2 in which said level control means for controlling said level of said surface of said protective material is a weir.

5. The device of claim 2 in which said sensor means for sensing the distance between said surface of said protective material and said predetermined point is a sonar beam so that the distance between said surface of said protective material and said predetermined fixed point may be determined so that the depth to which said board is dipped by said dip depth means may be accurately determined to within a minimum of 0.38 mm.

6. The device of claim 2 in which said dip depth control means is at least one motor driven screw jack attached to said tank.

7. The device of claim 3 in which said depth control means is at least one screw driven scissor jack attached to said tank.

8. In a machine for coating an electronic circuit board with a protective material by dipping said circuit board into said protective material, having a tank for holding said protective material and a conveyor system for moving said circuit board through said machine, the improvement comprising:

a fixture for supporting said circuit board as it passes through said machine and is coated with said protective material;

said fixture supporting said circuit board in a generally horizontal position to the surface of said protective material in said tank so that a predetermined area of said circuit board is dipped into said protective material;

said fixture having pivot means generally above the center of gravity of said fixture for pivoting;

said pivot means capable of engaging said conveyor system so that said fixture may pivot with respect to the orientation of said conveyor system and said circuit board is maintained in said generally horizontal position to said surface of said protective material;

said pivot means being at least one pivot block having at least one receptacle containing at least one pivot rod;

level control means for controlling the level of said surface of said protective material in said tank;

said level control means for controlling said level of said surface of said protective material being a weir;

sensor means for sensing the distance between said surface of said protective material and a predetermined point;

said sensor means for sensing the distance between said surface of said protective material and said predetermined point being a sonar beam so that the distant point may be determined so that the depth to which said board is dipped may be accurately determined to within a minimum of 0.38 mm, dip depth control means responsive to said sensor means, for controlling the depth to which said circuit board is dipped into said protective material so that said dip depth of said dip is controlled to a minimum of 0.38 mm;

said dip depth control means being at least one motor driven jack attached to said tank;

whereby a predetermined portion of said circuit board is coated with said protective material without the need for masking other portions of said circuit board with masking material.

* * * * *